United States Patent
Gafforelli et al.

(10) Patent No.: US 12,174,215 B2
(45) Date of Patent: Dec. 24, 2024

(54) MEMS SENSOR WITH COMPENSATION OF RESIDUAL VOLTAGE

(71) Applicant: INVENSENSE, INC., San Jose, CA (US)

(72) Inventors: Giacomo Gafforelli, Casatenovo (IT); Luca Coronato, Corsico (IT); Adolfo Giambastiani, San Marco (IT)

(73) Assignee: InvenSense, Inc., San Jose, CA (US)

( * ) Notice: Subject to any disclaimer, the term of this patent is extended or adjusted under 35 U.S.C. 154(b) by 489 days.

(21) Appl. No.: 17/102,116

(22) Filed: Nov. 23, 2020

(65) Prior Publication Data

US 2021/0102970 A1    Apr. 8, 2021

Related U.S. Application Data

(62) Division of application No. 15/363,333, filed on Nov. 29, 2016, now Pat. No. 10,877,063.

(Continued)

(51) Int. Cl.
*G01P 21/00* (2006.01)
*B81C 1/00* (2006.01)
(Continued)

(52) U.S. Cl.
CPC .......... *G01P 21/00* (2013.01); *B81C 1/00698* (2013.01); *G01P 15/125* (2013.01);
(Continued)

(58) Field of Classification Search
CPC ................... G01P 21/00; G01P 15/125; G01P 2015/0831; B81C 1/00698; B81B 2201/0235
(Continued)

(56) References Cited

U.S. PATENT DOCUMENTS 4,505,014 A    3/1985  McNeel
5,224,380 A    7/1993  Paik
(Continued)

FOREIGN PATENT DOCUMENTS

DE    112013006577         11/2015
DE    112013006577 T5 *    11/2015    ......... G01C 19/5726
(Continued)

*Primary Examiner* — Marrit Eyassu

(74) *Attorney, Agent, or Firm* — Van Hoven PC; Joshua Van Hoven; Stefan D. Osterbur

(57) ABSTRACT

A microelectromechanical (MEMS) sensor, such as an accelerometer, has one more proof masses that respond to movement of the sensor, the movement of which is measured based on a distance between the one or more proof masses and on one or more sense electrodes. The accelerometer also has a plurality of auxiliary electrodes and a signal generator configured to apply an auxiliary signal having a first harmonic frequency to the plurality of auxiliary electrodes. Circuitry receives a sensed signal from the plurality of sense electrodes and identifies a portion of the sensed signal having the first harmonic frequency. Based on this identified portion of the sensed signal, the circuitry determines whether a residual voltage is present on the one or more proof masses or on the one or more sense electrodes, and the circuitry modifies the operation of the accelerometer when the residual voltage is determined to be present in order to compensate for the residual voltage.

21 Claims, 8 Drawing Sheets

Related U.S. Application Data

(60) Provisional application No. 62/265,889, filed on Dec. 10, 2015.

(51) Int. Cl.
*G01P 15/08* (2006.01)
*G01P 15/125* (2006.01)

(52) U.S. Cl.
CPC .............. *B81B 2201/0235* (2013.01); *G01P 2015/0831* (2013.01)

(58) Field of Classification Search
USPC .......................................... 73/1.38
See application file for complete search history.

(56) References Cited

U.S. PATENT DOCUMENTS

| | | | |
|---|---|---|---|
| 5,506,454 A | 4/1996 | Hanzawa | |
| 5,587,518 A | 12/1996 | Stevenson | |
| 5,992,233 A | 11/1999 | Clark | |
| 6,170,332 B1 * | 1/2001 | MacDonald | G01P 1/006 73/514.32 |
| 6,675,630 B2 | 1/2004 | Challoner | |
| 7,444,868 B2 * | 11/2008 | Johnson | G01C 19/5719 73/504.12 |
| 10,564,179 B2 | 2/2020 | Gafforelli | |
| 2003/0033850 A1 * | 2/2003 | Challoner | G01C 25/00 702/93 |
| 2003/0200807 A1 | 10/2003 | Hulsing | |
| 2006/0213266 A1 * | 9/2006 | French | G01C 19/5719 73/504.02 |
| 2007/0012109 A1 | 1/2007 | Okada | |
| 2008/0000296 A1 * | 1/2008 | Johnson | G01C 19/5719 73/514.32 |
| 2008/0148846 A1 | 6/2008 | Whelan | |
| 2008/0295597 A1 | 12/2008 | Stewart | |
| 2009/0064781 A1 | 3/2009 | Ayazi | |
| 2009/0223276 A1 * | 9/2009 | Rudolf | G01C 19/5726 73/1.37 |
| 2009/0223277 A1 | 9/2009 | Rudolf | |
| 2010/0122565 A1 * | 5/2010 | Miller | G01P 15/125 73/1.37 |
| 2010/0145660 A1 | 6/2010 | Lang | |
| 2010/0186509 A1 * | 7/2010 | Loisel | G01P 21/00 73/514.34 |
| 2010/0199744 A1 | 8/2010 | Chan | |
| 2011/0265568 A1 * | 11/2011 | Stephanou | G01C 19/5769 73/514.32 |
| 2014/0176231 A1 * | 6/2014 | Spinella | G01P 15/125 327/538 |
| 2014/0182351 A1 | 7/2014 | Miller | |
| 2014/0250969 A1 | 9/2014 | Alagarsamy | |
| 2014/0260619 A1 | 9/2014 | Shaeffer | |
| 2015/0346003 A1 | 12/2015 | Youssef | |
| 2016/0011254 A1 * | 1/2016 | Maeda | G01R 31/2829 324/538 |
| 2017/0168084 A1 | 6/2017 | Gafforelli | |
| 2017/0168085 A1 | 6/2017 | Coronato | |

FOREIGN PATENT DOCUMENTS

| | | | |
|---|---|---|---|
| EP | 2428774 | 3/2012 | |
| WO | WO-2004038330 A2 * | 5/2004 | G01C 19/56 |

* cited by examiner

MEMS SENSOR WITH COMPENSATION OF RESIDUAL VOLTAGE

CROSS REFERENCE TO RELATED APPLICATIONS

This application is a divisional application of U.S. patent application Ser. No. 15/363,333, filed Nov. 29, 2016, and claims priority to U.S. Provisional Patent Application No. 62/265,889 entitled "First Harmonic Selftest for AZAccel Charging Check," filed Dec. 10, 2015. The contents of each of these applications are incorporated herein by reference for all purposes.

BACKGROUND

Numerous items such as smart phones, smart watches, tablets, automobiles, aerial drones, appliances, aircraft, exercise aids, and game controllers may utilize motion sensors during their operation. In many applications, various types of motion sensors such as accelerometers and gyroscopes may be analyzed independently or together in order to determine varied information for particular applications. For example, gyroscopes and accelerometers may be used in gaming applications (e.g., smart phones or game controllers) to capture complex movements by a user, drones and other aircraft may determine orientation based on gyroscope measurements (e.g., roll, pitch, and yaw), and vehicles may utilize measurements for determining direction (e.g., for dead reckoning) and safety (e.g., to recognizing skid or roll-over conditions).

Motion sensors such as accelerometers and gyroscopes may be manufactured as microelectromechanical (MEMS) sensors that are fabricated using semiconductor manufacturing techniques. A MEMS sensor may include movable proof masses that can respond to forces such as linear acceleration (e.g., for MEMS accelerometers) and angular velocity (e.g., for MEMS gyroscopes). The operation of these forces on the movable proof masses may be measured based on the movement of the proof masses in response to the forces. In some implementations, this movement is measured based on distance between the movable proof masses and sense electrodes, which form capacitors for sensing the movement.

Each motion sensor is calibrated such that a certain voltage of sense electrode corresponds to a certain separation distance between the sense electrode and a planar surface of a movable proof mass opposing the sense electrode. Any abnormal change to the voltage characteristics of the proof masses or the sense electrodes can introduce error.

SUMMARY OF THE INVENTION

In an exemplary embodiment, a method for compensating for a residual voltage on an accelerometer comprises applying, to a plurality of auxiliary electrodes located opposite one or more planar surfaces of one or more proof masses, an auxiliary signal having a first harmonic frequency. The method may further comprise determining, based on a signal from one or more sense electrodes located opposite the one or more planar surfaces, a sensed signal, identifying, from the sensed signal, a portion of the sensed signal having the first harmonic frequency, and determining, based on the portion of the sensed signal, that the residual voltage is present on the one or more proof masses or on the one or more sense electrodes. The method may further comprise modifying the operation of the accelerometer based on the determination that the residual voltage is present on the one or more proof masses or on the electrodes.

In an exemplary embodiment, an accelerometer comprises one or more proof masses having one or more planar surfaces, a plurality of auxiliary electrodes located opposite the one or more planar surfaces, a signal generator configured to apply an auxiliary signal to the plurality of auxiliary electrodes, the auxiliary signal having a first harmonic frequency, a plurality of sense electrodes located opposite the one or more planar surfaces, and circuitry coupled to provide a sensed signal based on a signal from the plurality of sense electrodes. In an embodiment, the circuitry identifies a portion of the sensed signal having the first harmonic frequency and determines, based on the portion of the sensed signal, that a residual voltage is present on the one or more proof masses or the plurality of sense electrodes. The circuitry may modify the operation of the accelerometer based on a determination that the residual voltage is present on the one or more proof masses or the plurality of sense electrodes.

In an exemplary embodiment, an accelerometer comprises one or more proof masses having one or more planar surfaces, a plurality of auxiliary electrodes located opposite the one or more planar surfaces, and a plurality of sense electrodes located opposite the one or more planar surfaces and configured to output a signal representative of a capacitance. The accelerometer may further comprise a first signal generator configured to apply an auxiliary signal to the plurality of auxiliary electrodes, the auxiliary signal having a first harmonic frequency, and a second signal generator configured to apply an operating signal to the accelerometer, the operating signal having an operating frequency different than the first harmonic frequency. In an embodiment, the accelerometer may comprise circuitry configured to determine a sensed signal from signal representative of the capacitance, the circuitry configured to identify a first portion of the sensed signal having the first harmonic frequency and to determine, based on the first portion of the sensed signal, that a residual voltage is present on the one or more proof masses or on the plurality of sense electrodes. The circuitry may be further configured to compensate for the residual voltage in response to a determination that the residual voltage is present on the one or more proof masses or on the plurality of sense electrodes. The circuitry may be further configured to identify a second portion of the sensed signal having the operating frequency and to determine, based on the second portion of the sensed signal, a linear acceleration for the accelerometer.

BRIEF DESCRIPTION OF THE DRAWINGS

The above and other features of the present disclosure, its nature and various advantages will be more apparent upon consideration of the following detailed description, taken in conjunction with the accompanying drawings in which.

DETAILED DESCRIPTION

Figure 1:
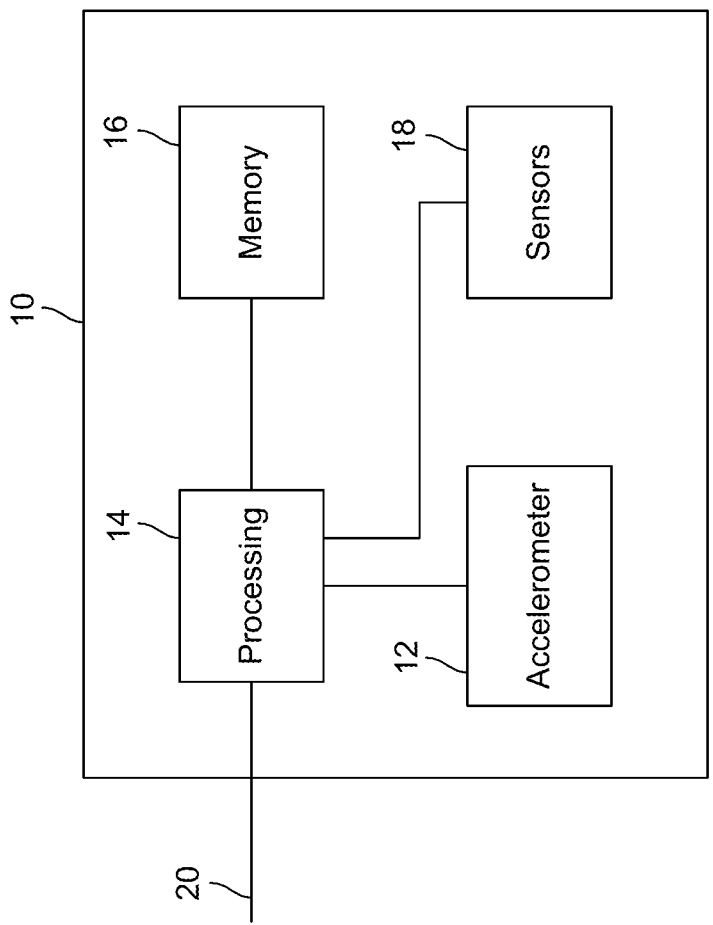
FIG. 1 shows an illustrative motion sensing system in accordance with an embodiment of the present disclosure.

A MEMS device is constructed of a number of layers such as a CMOS layer, a MEMS device layer, and a cap layer. The MEMS device layer includes a movable proof mass, at least one sense electrode for use in sensing a position or orientation of the proof mass, and at least one auxiliary electrode for use in applying an auxiliary signal to the proof mass. At least a portion of the proof mass is conductive such that the proof mass and a sense electrode opposing a planar surface of the proof mass form a capacitor. During operation, an operating signal having a voltage, referred to herein as "operating voltage," is applied to the conductive portion of the proof mass or the sense electrode. Motion of the MEMS device causes the proof mass to move with respect to the sense electrode thereby changing the distance between the proof mass and the sense electrode and, hence, changing the capacitance of the capacitor formed by the proof mass and the sense electrode. Processing circuitry measures the capacitance based on signals received from the sense electrode or proof mass, to determine a value indicative of the movement of the electrode. Based on a change in the capacitance, the processing circuitry determines a motion parameter indicative of motion (e.g., acceleration) of the MEMS device. As an example, the MEMS device may form an accelerometer or other type of motion sensor.

Over time, a residual charge may build on the proof mass or on the sense electrodes, generating undesired electrostatic forces and undesired proof mass movement. The voltage induced by this residual charge, referred to herein as the "residual voltage," can cause error in the motion parameter measured by the MEMS device. In this regard, the MEMS device is calibrated such that a certain sensed signal corresponds to a certain distance between the sense electrode and the proof mass. The presence of the residual voltage affects the sensed voltage such that it does not accurately reflect the actual distance between the sense electrode and the proof mass. In general, the error induced by the residual charge increases as the residual voltage increases relative to an original (e.g., calibrated) voltage.

In some embodiments, an auxiliary electrode is used to determine a presence of the residual voltage. In this regard, an auxiliary signal is applied to the proof mass by auxiliary electrodes. The auxiliary signal may be an alternating current (AC) signal having a first harmonic frequency that is different than the frequency of the signal that applies the operating voltage to the proof mass or sense electrodes. If a residual voltage is not present on the proof mass or sense electrodes, then the auxiliary signal should not generate a force or should generate only a small force that is imparted to cause additional movement of the proof mass relative to the sense electrodes. In the case of sense electrodes that are balanced with respect to the proof mass (e.g., located symmetrically) and a differential AC auxiliary signal, the auxiliary signal should generate any fore or movement of the proof mass relative to the sense electrodes. However, if a residual voltage is present on the proof mass, then the auxiliary signal generates a force that causes movement of the proof mass, at the first harmonic frequency of the auxiliary signal. In general, the movement will be greater for higher residual voltages.

This movement may be measured based on a signal from the sense electrode or proof mass, which is filtered in order to isolate the voltage at the frequency of the operating signal from the voltage at the first harmonic frequency or other frequencies of the auxiliary signal. The processing circuitry may use the received signal at the frequency of the operating signal in order to determine a motion parameter (e.g., an acceleration value), as described above. The processing circuitry may use the received signal at the frequency of the auxiliary signal, in order to detect residual voltage on the proof mass. In this regard, the residual voltage should be proportional to the measured response to the auxiliary voltage at the first harmonic frequency. In some embodiments, the processing circuitry may be configured to determine a value representing a measurement of the amount of residual voltage present on the sense electrode. If the value exceeds a threshold, the processing circuitry may be configured to take one or more actions as may be desired.

As an example, the processing circuitry may be configured to generate a warning or other indication for indicating that the measurements of the MEMS device may be erroneous or unreliable. The information provided by the processing circuitry may be used to display or otherwise render a message to a user for warning the user about the potential unreliability of the readings from the MEMS device. In another example, the information provided by the processing circuitry may be used to disable one or more components or systems from relying on or using the readings from the MEMS device.

In some embodiments, when the residual voltage is determined to exceed a threshold, the processing circuitry may initiate a compensation procedure in order to compensate for the presence of the residual voltage. As an example, the MEMS device may be re-calibrated in order to account for the residual voltage measured by the processing circuitry. In another example, a procedure may be initiated for removing or reducing the residual charge on the proof mass. In yet another example, a voltage may be applied to the proof mass, sense electrodes, or auxiliary electrodes, in order to move the proof mass by an amount that offsets the movement induced by the residual voltage. In other examples, other actions may be taken based on the amount of residual voltage detected by the processing circuitry.

FIG. 1 depicts an exemplary motion sensing system 10 in accordance with some embodiments of the present disclosure. Although particular components are depicted in FIG. 1, it will be understood that other suitable combinations of sensors, processing components, memory, and other circuitry may be utilized as necessary for different applications and systems. In an embodiment as described herein, the motion sensing system may include at least a MEMS accelerometer 12 and supporting circuitry, such as processing circuitry 14 and memory 16. In some embodiments, one or more additional sensors 18 (e.g., additional MEMS gyroscopes, MEMS accelerometers, MEMS microphones, MEMS pressure sensors, and a compass) may be included within the motion processing system 10 to provide an integrated motion processing unit ("MPU") (e.g., including 3 axes of MEMS gyroscope sensing, 3 axes of MEMS accelerometer sensing, microphone, pressure sensor, and compass).

Processing circuitry 14 may include one or more components providing necessary processing based on the requirements of the motion processing system 10. In some embodiments, processing circuitry 14 may include hardware control logic that may be integrated within a chip of a sensor (e.g., on a substrate or cap of an accelerometer 12 or other sensor 18, or on an adjacent portion of a chip to the accelerometer 12 or other sensor 18) to control the operation of the accelerometer 12 or other sensor 18 and perform aspects of processing for the accelerometer 12 or other sensor 18. In some embodiments, the accelerometer 12 and other sensors 18 may include one or more registers that allow aspects of the operation of hardware control logic to be modified (e.g., by modifying a value of a register). In some embodiments, processing circuitry 14 may also include a processor such as a microprocessor that executes software instructions, e.g., that are stored in memory 16. The microprocessor may control the operation of the accelerometer 12 by interacting with the hardware control logic, and process signals received from accelerometer 12. The microprocessor may interact with other sensors in a similar manner.

Although in some embodiments (not depicted in FIG. 1), the accelerometer 12 or other sensors 18 may communicate directly with external circuitry (e.g., via a serial bus or direct connection to sensor outputs and control inputs), in an embodiment the processing circuitry 14 may process data received from the accelerometer 12 and other sensors 18 and communicate with external components via a communication interface 20 (e.g., a SPI or I2C bus, or in automotive applications, a controller area network (CAN) or Local Interconnect Network (LIN) bus). The processing circuitry 14 may convert signals received from the accelerometer 12 and other sensors 18 into appropriate measurement units (e.g., based on settings provided by other computing units communicating over the communication bus 20) and perform more complex processing to determine measurements such as orientation or Euler angles, and in some embodiments, to determine from sensor data whether a particular activity (e.g., walking, running, braking, skidding, rolling, etc.) is taking place.

In some embodiments, certain types of information may be determined based on data from multiple accelerometers 12 and sensors 18, in a process that may be referred to as sensor fusion. By combining information from a variety of sensors it may be possible to accurately determine information that is useful in a variety of applications, such as image stabilization, navigation systems, automotive controls and safety, dead reckoning, remote control and gaming devices, activity sensors, 3-dimensional cameras, industrial automation, and numerous other applications.

An exemplary MEMS accelerometer (e.g., accelerometer 12) may include one or more movable proof masses that are configured in a manner that permits the MEMS accelerometer to measure linear acceleration along an axis. In some embodiments, the one or more movable proof masses may be suspended from anchoring points, which may refer to any portion of the MEMS sensor which is fixed, such as an anchor that extends from a layer (e.g., a CMOS layer) that is parallel to the MEMS layer of the device, a frame of the MEMS layer of the device, or any other suitable portion of the MEMS device that is fixed relative to the movable proof masses. The proof masses may be arranged in a manner such that they move in response to linear acceleration. The movement of the proof masses relative to a fixed surface (e.g., a fixed electrode) in response to linear acceleration is measured and scaled to determine linear acceleration or some other motion parameter.

Figure 2:
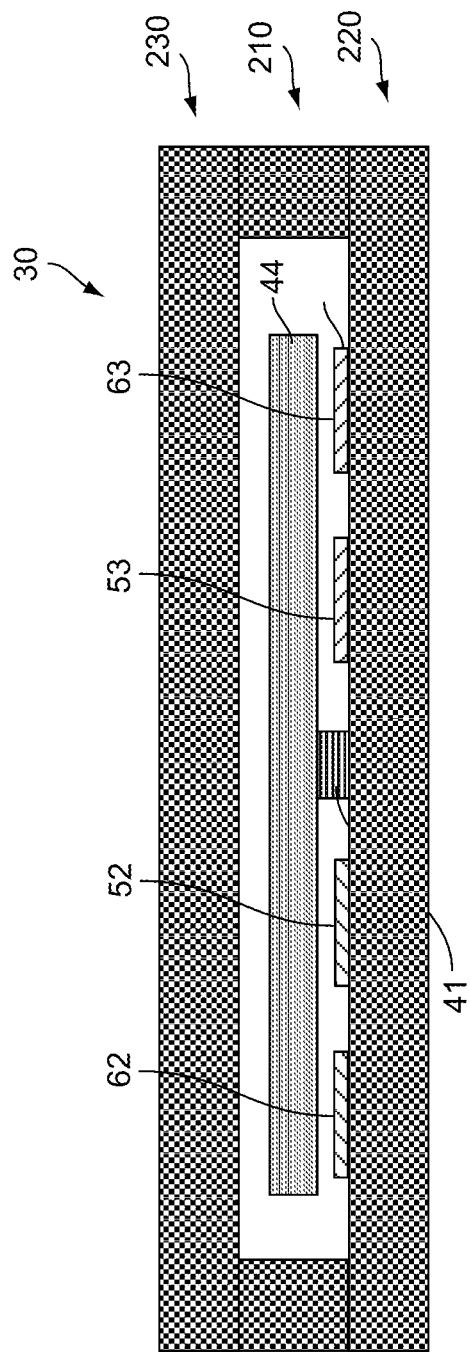
FIG. 2 shows an illustrative motion sensing system having a movable proof mass that pivots about an anchoring point in accordance with some embodiments of the present disclosure.

FIG. 2 depicts an illustrative motion sensing system 30 that is configured to sense residual voltage in accordance with some embodiments of the present disclosure. Although particular components are depicted and configured in a particular manner in FIG. 2, it will be understood that a motion sensing system 30 may include other suitable components and configurations.

In the embodiment of FIG. 2, the system 30 is implemented as a MEMS device, such as a MEMS accelerometer, constructed of a plurality of bonded semiconductor layers. Although a MEMS device may be constructed in a variety of manners, in an embodiment, the MEMS device may include a substrate 220, a MEMS layer 210, and a cap layer 230 that are bonded together at certain points to form a hermetically sealed package. The substrate 220 may include CMOS circuitry and form a CMOS layer of the MEMS device, though the CMOS circuitry may reside in other portions of the device, such as cap layer 230. An exemplary MEMS layer may be produced using semiconductor manufacturing techniques to construct micromechanical components for use in applications such as MEMS sensors (e.g., accelerometers, gyroscopes, pressure sensors, microphones, etc.). An exemplary CMOS layer may provide for the integration of electrical components and devices within the CMOS layer, and may also provide for interconnections between those components. In some embodiments, the components of the MEMS layer 210 may be conductive, and interconnections between components of the MEMS layer and the CMOS layer may be provided. As an example, circuitry within the CMOS layer may electrically couple electrical components (e.g., electrodes or movable proof masses) of the MEMS layer to processing circuitry 14 or other electrical components.

Figure 3:
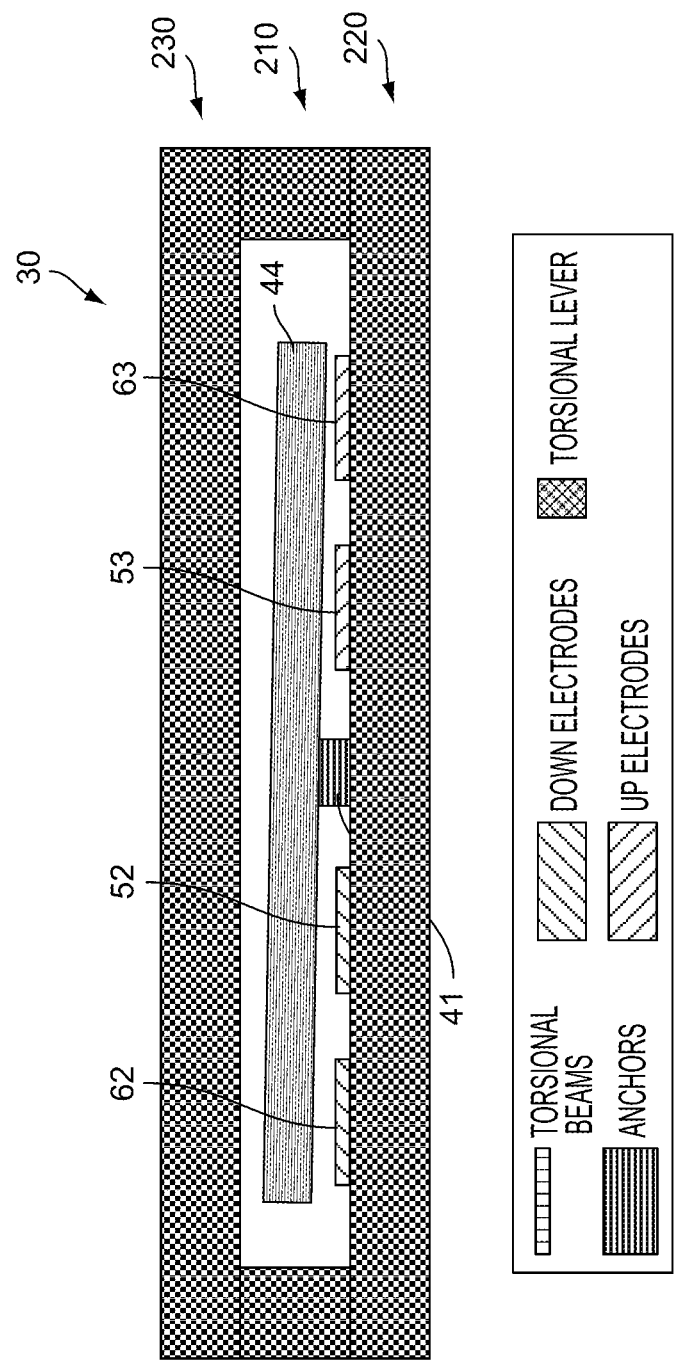
FIG. 3 shows the motion sensing system of FIG. 3 after the movable proof mass has pivoted about the anchoring point in the clockwise direction in accordance with some embodiments of the present disclosure.

In an exemplary embodiment, the MEMS layer 210 may include at least one anchoring point 41 and at least one movable proof mass 44 that is attached to the anchoring point 41 and suspended above the substrate 220. The anchoring point 41 may be fixedly attached (e.g., bonded) to and extend from a planar surface of the substrate 220. The anchoring point 41 and the movable proof mass 44 may be composed of conductive material, and the movable proof mass 44 may be arranged to pivot about the anchoring point 41 such that one end of the proof mass 44 tilts up while the other end tilts down. Thus, when one side of the proof mass surface moves away from the substrate 220 the other side of the proof mass surface on the opposite end moves toward the substrate 220. FIG. 3 shows the proof mass 44 after it has pivoted about the anchoring point 41 in a clockwise direction. In an embodiment, the anchoring point 41 is electrically coupled to a signal generator 49 (FIG. 4), e.g., a voltage source, that applies an operating signal to the proof mass 44 through the anchoring point 41. In other embodiments, the anchoring point 41 may reside on other components, such as the cap layer 230 or extensions of the MEMS Layer 210, and different types of relative motion of one or more proof masses may be implemented based on the type of anchoring that is used and the configuration of components within the MEMS layer 210 such as masses, springs, levers, and other couplings.

The system 30 may also comprise at least one sense electrode that, in conjunction with the proof mass 44, forms a capacitor. In some embodiments, the signal generator 49 (not depicted) may be coupled to the sense electrodes to apply the operating signal to the sense electrodes. The exemplary embodiment of FIG. 2 shows two sense electrodes 52 and 53 positioned on a planar surface of the substrate 220 on opposite sides of the anchoring point 41, but other numbers and arrangements of sense electrodes are possible in other embodiments. Each sense electrode 52 and 53 faces an opposite surface of the proof mass 44 that is suspended above the substrate 220. Using these sense electrodes 52 and 53, the position of the proof mass 44 is capacitively sensed. In this regard, the value of the capacitance between sense electrode 52 and the proof mass may be sensed in order to determine the distance of the proof mass 44 from the sense electrode 52, and the value of the capacitance between sense electrode 53 and the proof mass 44 may be sensed, and the sensed capacitances may be utilized to generate a sensed signal in order to determine the distance of the proof mass 44 from the sense electrode 53. In an exemplary embodiment, the memory 16 (FIG. 1) stores data that is used by the processing circuitry 14 in order to convert the sensed voltage into measurements of motion, e.g., acceleration. This data may be calibrated during manufacturing or at other times such that a certain movement by the proof mass 44 corresponds to a certain change in the measured motion parameter, e.g., acceleration. In some embodiments, this calibration may also correspond to an initial residual voltage that may exist on either of the sense electrodes or proof mass, and that may not result in the proof mass 44 being substantially balanced in the absence of linear acceleration.

As shown by FIG. 2, the system 30 may further comprise auxiliary electrodes 62 and 63 that are used to apply an auxiliary signal to the proof mass 44. Although an auxiliary electrode may be located at a variety of locations and orientations relative to the proof mass 44, in an embodiment each auxiliary electrode 62 and 63 may reside on a planar surface of the substrate 220 and face an opposite surface of the proof mass 44 suspended above the substrate 220. The auxiliary electrodes 62 and 63 may be coupled to a signal generator 66 (FIG. 4) that generates an AC signal (e.g., a differential AC signal) having a first harmonic frequency different than the frequency of the operating signal that is applied to the proof mass 44 or the sense electrodes 52 and 53. As an example, the signal generator 66 may comprise a voltage source.

The frequency of the auxiliary signal may be sufficiently different than the frequency of the operating signal to permit separation of the auxiliary signal from the operating signal generated by the signal generator 49, as will be describe in more detail below. In some embodiments, at least the first harmonic frequency and the second harmonic frequency of the auxiliary signal are both more than 5% away from a resonance frequency of the MEMS device (e.g., accelerometer). In at least one embodiment, at least the first harmonic frequency and the second harmonic of the auxiliary signal are both less than half of the resonance frequency of the MEMS device (e.g., accelerometer). In some embodiments, the first harmonic frequency of the auxiliary signal is greater than the resonance frequency for the MEMS device (e.g., accelerometer). In other embodiments, other values of the first and second harmonic frequencies of the auxiliary signal are possible.

As depicted and described herein, in an embodiment, auxiliary electrodes may be located relative to the proof mass 44 in a manner such that under normal operating conditions any force created as a result of the applied auxiliary signal is balanced, e.g., based on a balanced (e.g., symmetric) construction of the accelerometer MEMS layer components. In embodiments, and depending on the configuration and relative location of the proof mass and the auxiliary electrodes, the auxiliary voltage may be provided to the auxiliary electrodes in a variety of manners, such as a differential signal having common phase and magnitude (e.g., resulting in balanced forces in a balanced accelerometer configuration). In other embodiments, the auxiliary signals may be applied as common mode signals, e.g., for certain unbalanced configurations.

Figure 4:
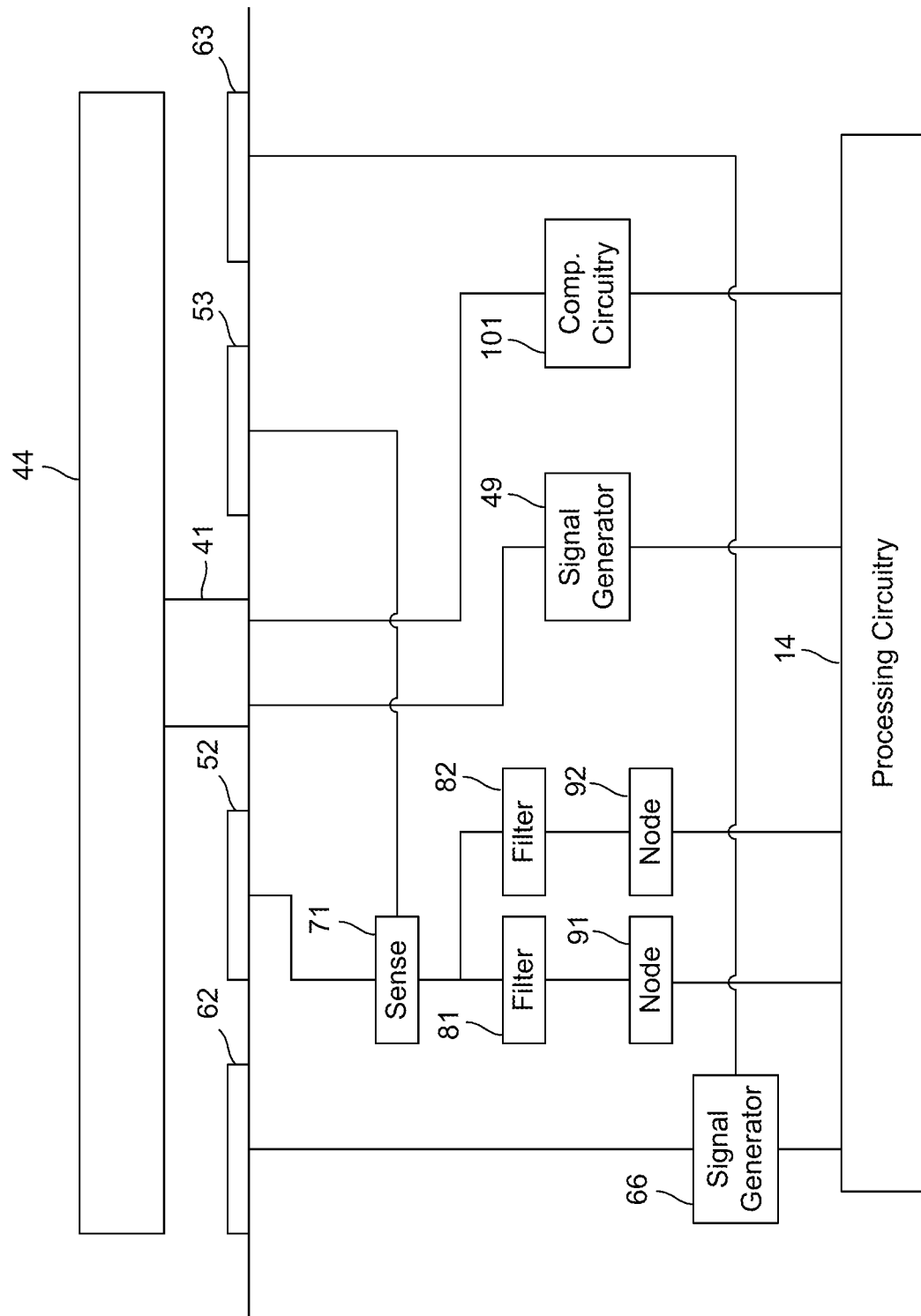
FIG. 4 shows an illustrative motion sensing system having circuitry that senses when a residual voltage is present on a movable proof mass or a sense electrode, and that compensates for such residual voltage in accordance with some embodiments of the present disclosure.

As shown by FIG. 4, each of the sense electrodes 52 and 53 are electrically coupled to sense circuit 71. In an embodiment, sense circuit 71 may receive signals representative of a first capacitance formed by sense electrode 52 and first portion of proof mass 44, and of a second capacitance formed by sense electrode 53 and a second portion of proof mass 44. The signals may be processed by the sense circuit 71 to output an electrical signal (e.g., a voltage or current) based on the sensed capacitances. In an embodiment, the sense circuit may include a differential charge amplifier having the sensed capacitance signals as an input, and may output a sensed signal that is based on (e.g., proportional to) the difference between the sensed capacitances.

The sense circuit 71 may be connected to a plurality of filters such as bandpass filters 81 and 82, which are electrically coupled to measurement nodes 91 and 92, respectively. Although filters are depicted and described herein as providing desired filtering to extract portions of a sensed signal having particular frequencies, in some embodiments, sense circuitry such as at a measurement node may identify information at the relevant frequency without other frequency information being removed, e.g., a raw sensed signal, or signal that undergoes previous noise filtering. A measurement node may be any suitable components to measure a signal or electrical voltage, such as amplifiers, filters, analog-to-digital converters, frequency filters, etc. A measurement node may also include processing circuitry (e.g., hardware control logic and/or other processing circuitry 14) to compare the received signal to thresholds or perform other signal analysis such as measuring responses to different voltages or signals.

The filter 81 permits energy at the frequency of the operating signal, referred to herein as "operating frequency," from the signal generator 49 to pass while blocking energy at other frequencies, including at least the first harmonic frequency of the auxiliary signal. Thus, the measurement node 91 receives a portion of the sensed signal from the sense circuit 71 within a band that includes at least the operating frequency and provides a value indicative of this sensed voltage to the processing circuitry 14. Further, the filter 82 permits energy at the first harmonic frequency of the auxiliary signal to pass while blocking energy at other frequencies, including at least the operating frequency. Thus, the measurement node 92 senses a portion of the sensed signal from the sense circuit 72 within a band that includes at least the first harmonic frequency of the auxiliary signal and provides a value indicative of this sensed voltage to the processing circuitry 14.

As described above, the signal generator 49 is configured to apply an operating signal to the movable proof mass 44. However, it will be understood that in other embodiments (not depicted herein), the signal generator 49 may apply the operating signal to the sense electrodes 52 and 53. In one embodiment, this operating signal is an AC signal having a frequency different than the first harmonic frequency of the auxiliary signal applied by the signal generator 66. The movable proof mass 44 and the sense electrodes 52 and 53 form capacitors that are used to capacitively sense movement of the proof mass 44. In this regard, forces acting on the system 30 (e.g., acceleration) from movement of the system 30 causes the proof mass 44 to pivot about the anchoring point 41 generating a signal modulated at the operating frequency. Pivoting of the proof mass 44 in the clockwise direction generally increases the distance between the proof mass 44 and the sense electrode 52 and decreases the distance between the proof mass 44 and sense electrode 53. Pivoting of the proof mass 44 in a counter-clockwise direction generally decreases the distance between the proof mass 44 and the sense electrode 52 and increases the distance between the proof mass 44 and the sense electrode 53. Movement of the proof mass 44 relative to the sense electrode 52 affects the capacitance of the electrodes 52 and 53, which causes the sense circuit 71 to generate a sensed signal that is based on the movement of the proof mass.

As described above, the sensed signal is provided to each of the filters 81 and 82 to pass the operating signal and the auxiliary signal, respectively. A signal filtered to optimize the frequency content at the operating frequency is passed to measurement node 91, which performs measurement and/or analysis of the filtered signal and provides an output to the processing circuitry 14. A signal filtered to optimize the frequency content at the auxiliary frequency is passed to measurement node 92, which performs measurement and/or analysis of the filtered signal and provides an output to the processing circuitry 14. Although in the context of the present disclosure, the sense circuit 71, filters 81 and 82, and measurement nodes 91 and 92 may be described as being located separate from the processing circuitry 14, it will be understood that some or all of these components may be part of the processing circuitry, e.g., within a CMOS layer of the MEMS device. The processing circuitry 14 is configured to convert the measurements of the nodes 91 and 92 into measurements of a motion parameter, such as acceleration.

Over time, a residual charge may build on the proof mass 44 and/or the sense electrodes 52 and 53, thereby introducing error into the system 30. Specifically, due to the residual voltage, an undesired electrostatic force could be generated, which may change the position of the proof mass and generate an incorrect readout.

In some embodiments, the processing circuitry 14 is configured to detect a presence of the residual charge using the auxiliary signal applied to the proof mass 44 by the signal generator 66. In an exemplary embodiment, a differential voltage is applied at the two auxiliary electrodes 62 and 63, with a first polarity auxiliary signal $V_{1H}$ applied at auxiliary electrode 62 and an opposite polarity auxiliary signal $V_{1H}$ applied at auxiliary electrode 63 and with a DC voltage value equal to the average voltage $V_{PM}$ on the proof mass 44. The voltage at auxiliary electrode 62 will be represented by the below equation:

$$V_{1HP} = V_{PM} + V_{1H} \sin(\Omega_{1H} t) \quad (1)$$

where $\Omega_{1H}$ is the first harmonic frequency of the AC voltage signal from the signal generator 66.

The voltage at auxiliary electrode 63 will be represented by the below equation:

$$V_{1HN} = V_{PM} - V_{1H} \sin(\Omega_{1H} t). \quad (2)$$

where $\Omega_{1H}$ is the first harmonic frequency of the AC voltage signal from the signal generator 66.

If a residual voltage on the proof mass 44 is not present, then the auxiliary signal from the voltage generator 66 generates no force that causes the proof mass 44 to move. In this regard, an electrostatic force ($F_{1HP}$) exerted on the proof mass 44 by application of the auxiliary signal through the auxiliary electrode 62 is represented by the following equation when no residual voltage is present on the proof mass 44:

$$F_{1HP} \alpha V_{1H}^2 \sin^2(\Omega_{1H} t) = \tfrac{1}{2} V_{1H}^2 (1 - \cos(2\Omega_{1H} t)) \quad (3)$$

Further, an electrostatic force ($F_{1HN}$) exerted on the proof mass 44 by application of the auxiliary signal through the auxiliary electrode 63 is represented by the following equation when no residual voltage is present on the proof mass 44:

$$F_{1HN} \alpha V_{1H}^2 \sin^2(\Omega_{1H} t) = \tfrac{1}{2} V_{1H}^2 (1 - \cos(2\Omega_{1H} t)) \quad (4)$$

Thus, $F_{1HP}$ cancels $F_{1HN}$ resulting in no net force applied to the proof mass 44 from the auxiliary signal. That is, the total electrostatic force ($F_{1H}$) exerted on the proof mass 44 by application of the auxiliary signal is represented by the following equation when no residual voltage is present on the proof mass:

$$F_{1H} = F_{1HP} - F_{1HN} = 0. \quad (5)$$

Therefore, if there is no residual voltage present, then the voltage measurements by the measurement node should be close to zero.

However, if a residual voltage ($V_{res}$) on the proof mass 44 is present, then the auxiliary signal from the voltage generator 66 generates a force that causes the proof mass 44 to move. In such a situation, the electrostatic force ($F_{1HP}$) exerted on the proof mass 44 by application of the auxiliary signal through the auxiliary electrode 62 is represented by the following equation:

$$F_{1HP} \propto V_{1HP}^2 = \tfrac{1}{2} V_{1H}^2 (1 - \cos(2\Omega_{1H} t)) + V_{res}^2 + 2 V_{res} V_{1H} \sin(\Omega_{1H} t) \quad (6)$$

Further, the electrostatic force ($F_{1HN}$) exerted on the proof mass 44 by application of the auxiliary signal through the auxiliary electrode 63 is represented by the following equation:

$$F_{1HN} \propto V_{1HN}^2 = \tfrac{1}{2} V_{1H}^2 (1 - \cos(2\Omega_{1H} t)) + V_{res}^2 - 2 V_{res} V_{1H} \sin(\Omega_{1H} t) \quad (7)$$

Thus, the equation for the total electrostatic force ($F_{1H}$) becomes:

$$F_{1H} = F_{1HP} - F_{1HN} = \tfrac{1}{2} V_{1H}^2 (1 - \cos(2\Omega_{1H} t)) - \tfrac{1}{2} V_{1H}^2 (1 - \cos(2\Omega_{1H} t)) + V_{res}^2 - V_{res}^2 + 2 V_{res} V_{1H} \sin(\Omega_{1H} t) - 2 V_{res} V_{1H} \sin(\Omega_{1H} t) = 4 V_{res} V_{1H} \sin(\Omega_{1H} t). \quad (8)$$

Therefore, if a residual voltage is present, then the voltage measured at the measurement node 92 will not be zero. Further, the magnitude of the voltage measured by the measurement node 92 will be proportional to the residual voltage such that the measurements by the node 92 are indicative of the magnitude of the residual voltage.

In some embodiments, the processing circuitry 14 may compare the voltage measurements from the measurement node 92 (e.g., measurement of the portion of the sensed signal at the auxiliary frequency) to at least one predefined threshold and detect the presence of a residual voltage when the threshold is exceeded. A threshold compared to the output of node 92 (or at node 92) may correspond to a minimum value at which residual voltage affects device performance, for example, based on a total offset specification. For example, a first threshold may correspond to 50% of the total offset specification, while a second threshold may correspond to 100% of the total offset spec. The first threshold may correspond to a compensation operation, while the second threshold may correspond to a damaged device and that requires an alarm and the shut-down of the accelerometer.

The processing circuitry 14 may be configured to take any of various actions in response to a detection of a residual voltage. As an example, the processing circuitry 14 may transmit a warning signal to external components (not shown) or systems via the communication interface 20 (FIG. 1). Such a warning signal may be used in a variety of ways. For example, a warning message may be displayed to a user informing the user that the measurements of the system 30 may be erroneous. In another example, one or more external components or systems may be disabled from using the measurements of the system 30. In other embodiments, other actions may be taken in response to the warning signal provided by the processing circuitry 14.

When the presence of a residual voltage is detected, the processing circuitry 14 may take at least some actions in an attempt to compensate the system 30 for the residual voltage thereby eliminating or reducing the effects of the residual voltage. As an example, under the direction and control of the processing circuitry 14, a direct current (DC) voltage signal may be applied to the proof mass 44 for compensating for the residual voltage. In this regard, the processing circuitry 14 may be coupled to compensation circuitry 101 (FIG. 4), such as a DC voltage source, that is configured to apply a compensation signal (e.g., a DC voltage, AC signal, or combination thereof) to the proof mass 44. Such compensation circuitry 101 may be electrically coupled to the proof mass 44 through the anchoring point 41, as shown by FIG. 4. However, the compensation circuitry 101 may be configured to apply the compensation signal to the proof mass 44 in other ways. As an example, the compensation circuitry 101 may be electrically coupled to any of the electrodes 52, 53, 62, or 63 for applying a compensation signal through one or more such electrodes to the proof mass 44. When the processing circuitry 14 detects the presence of a residual voltage, the processing circuitry 14 may be configured to appropriately control the compensation circuitry 101 to apply a compensation signal of sufficient magnitude in order compensate for the residual voltage.

In controlling the compensation circuitry 101, the processing circuitry 14 may use feedback from the auxiliary signal in order to control the magnitude or other characteristic of the compensation signal. As an example, the processing circuitry 14 may use the measurements of the nodes 91 and 92 as feedback for controlling the voltage of the compensation signal in order to drive such measurements to zero or at least below a predefined threshold. For example, the processing circuitry 14 may increase the output voltage of the compensation circuitry 101 until the voltage measurements of the nodes 91 and/or 92 fall below a threshold. In other embodiments, other algorithms for controlling the compensation circuitry 101 for compensating for the residual voltage are possible.

Figure 5:
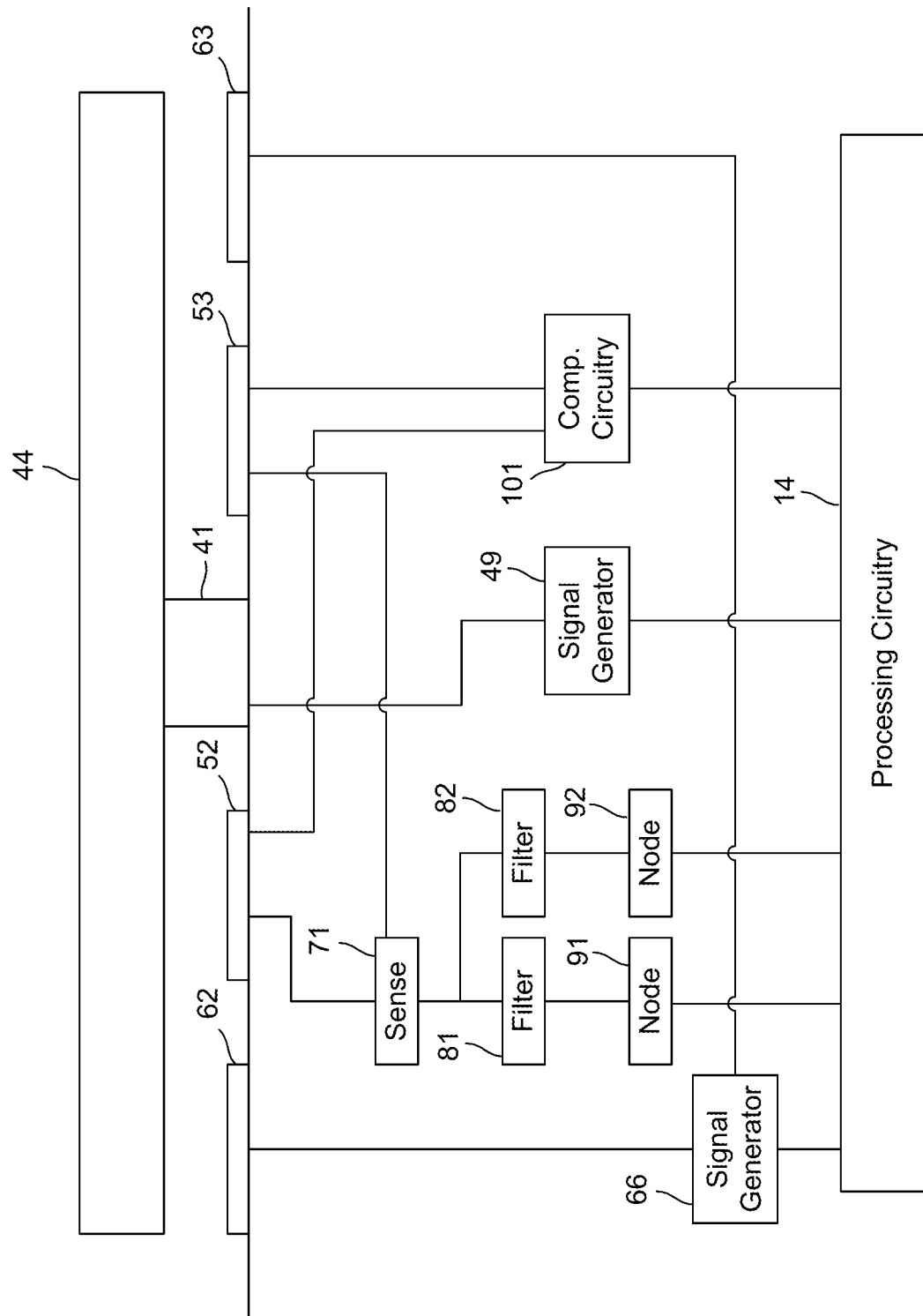
FIG. 5 shows an illustrative motion sensing system having circuitry that senses when a residual voltage is present on a movable proof mass or the sense electrode, and that compensates for such residual voltage in accordance with some embodiments of the present disclosure.

Note that the compensation circuitry 101 may be electrically coupled to any number of electrodes. As an example, the compensation circuitry 101 may be electrically coupled to at least one electrode 52 and 62 on one side of the anchoring point 41 and at least one electrode 53 and 63 on an opposite side of the anchoring point 41. FIG. 5 shows the compensation circuitry 101 electrically coupled to the sense electrodes 52 and 53 for selectively applying a compensation signal to at least one of the electrodes 52 or 53 depending on the position of the proof mass 44. In this regard, depending on which direction the residual voltage causes the proof mass 44 to tilt, the compensation circuitry 101 may apply a compensation signal through at least one electrode 52 or 53 appropriate for exerting a force on the proof mass 44 that tends to move the proof mass 44 back to a neutral position (i.e., away from the direction of tilt induced by the residual voltage). That is, the compensation signal may be used to adjust the position of the proof mass 44 such that the effect of the residual voltage to the position of the proof mass 44 is cancelled by the effect of the compensation signal. In other embodiments, the compensation circuitry 101 may be coupled to other electrodes, such as the auxiliary electrodes 62 and 63 for similarly controlling the position of the proof mass 44 in order to compensate for the effects of the residual voltage. In further embodiments, a plurality of compensation electrodes distinct from the sense electrodes and the auxiliary electrodes may be located relative to the proof mass 44 (e.g., symmetrically balanced on a plane underlying the proof mass 44) and the compensation signal may be provided to the compensation electrodes.

In some embodiments, the processing circuitry 14 may be configured to adjust the measurements of the motion parameter based on a residual voltage sensed by the system 30. As an example, the processing circuitry 14 may adjust scaling factors or other data in order to account for the amount of residual voltage sensed by the system 30. In this regard, the processing circuitry 14 may be configured to multiply or otherwise combine a scaling factor to the voltage measurements received from the measurement nodes 91 and 92 when converting these voltage measurements into measurements of the motion parameter (e.g., acceleration) provided by the system 30. Based on the amount of residual voltage detected by the system 30, the processing circuitry 14 may be configured to adjust the scaling factor in order to account for the residual voltage. Alternatively, the data used by the processing circuitry 14 for converting voltage measurements by the nodes 91 and 92 into measurements of the motion parameter may be automatically re-calibrated by the processing circuitry 14 based on the sensed residual voltage in an effort to account for the residual charge that has accumulated on the proof mass 44.

In yet other embodiments, the processing circuitry 14 may be responsive to a detection of residual voltage for taking at least one action to remove or reduce the residual charge that has accumulated on the proof mass 44. As an example, the processing circuitry 14 may control connectivity of the proof mass 44 to at least one electrical component for discharging the residual charge that has accumulated on the proof mass 44.

Note that the system 30 may be configured to run a test for sensing a residual voltage at any time, including during operation of the system 30 for sensing the motion parameter. In this regard, as described above, the auxiliary signal generated by the signal generator 66 has a frequency different than the frequency of the operating signal generated by the signal generator 49. Thus, by using filters, voltages induced by the auxiliary signal can be separated from voltages induced by the operating signal allowing the system 30 to take measurements of the motion parameter while simultaneously checking for the presence of a residual voltage on the proof mass 44.

Figure 6:
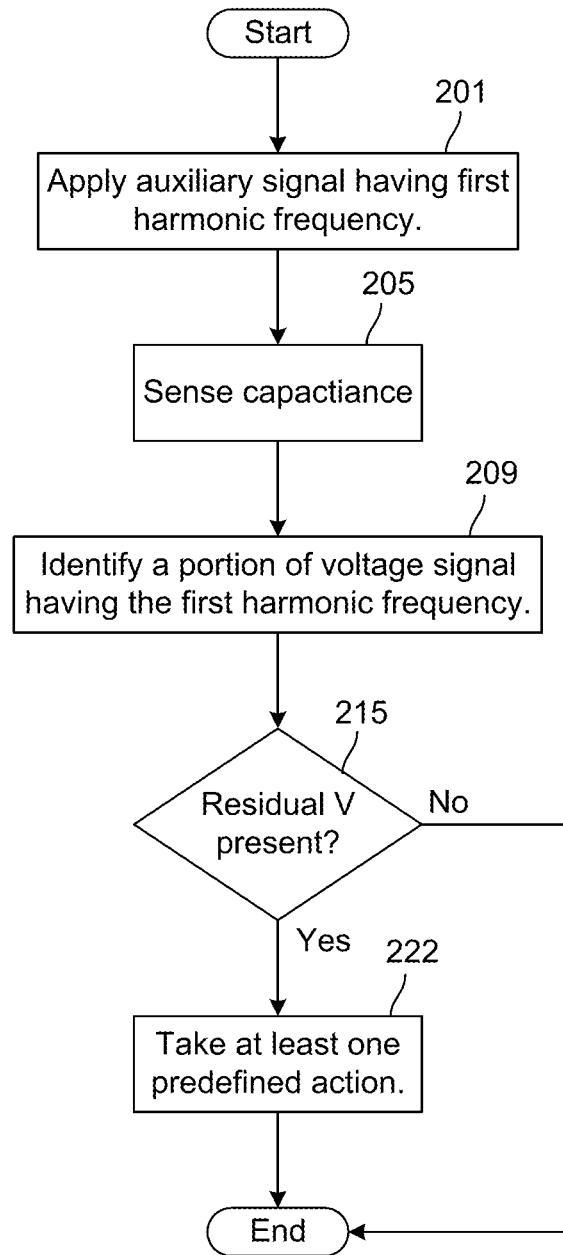
FIG. 6 shows exemplary steps for sensing whether a residual voltage is present on a movable proof mass or a sense electrode of a motion sensing system in accordance with some embodiments of the present disclosure.

FIG. 6 depicts exemplary steps of sensing a residual voltage of a movable proof mass and/or sensing electrodes in accordance with some embodiments of the present disclosure. In the context of FIG. 6, the steps will be described in the context of the exemplary balanced accelerometer of FIG. 4 or 5. However, it will be understood that the steps of FIG. 6 may similarly be applied to other gyroscope designs and configurations.

At step 201, the signal generator 66 generates an auxiliary signal having a first harmonic frequency that is different than the frequency of the operating signal generated by the signal generator 49. This auxiliary signal may be applied to the proof mass 44 via the auxiliary electrodes 62 and 63. If there is no residual voltage on the mass 44 or sense electrodes 52 and 53, then the force induced by application of the auxiliary signal at the auxiliary electrode 63 offsets the force induced by application of the auxiliary signal at the auxiliary electrode 62 at the opposite end of the proof mass 44. For example, application of the auxiliary signal at the electrode 62 may generate an electrostatic force that tends to the pull the proof mass 44 to the electrode 62, and application of the auxiliary signal at the electrode 63 may generate an electrostatic force that tends to the pull the proof mass 44 to the electrode 63. In such embodiments, the electrostatic forces may be substantially equal and at opposite ends of the proof mass 44 such that there is no net force applied to the proof mass 44 via signal generator 66. In such a situation, application of the auxiliary signal on the proof mass 44 should not induce a sensed signal variation at the first harmonic frequency of the auxiliary signal. However, if there is a residual voltage on the proof mass 44 or sense electrodes 52 and 53, then the forces induced by the auxiliary signal do not completely cancel, resulting in a finite force on the proof mass 44 at least at the first harmonic frequency of the auxiliary signal.

At step 205, capacitance signals from the sense electrodes 52 and 53 may be provided to sensing circuit 71. Sensing circuit 71 may output a sensed signal that may be based on the movement of the proof mass 44 (e.g., as a result of changes in capacitance sensed at a circuit such as a differential charge amplifier). The sensed signal may be provided to filters 81 and 82.

At step 209, each of the filters 81 and 82 receives the sensed signal. Filter 81 may be configured (e.g., have pass-band) that corresponds to the operating frequency while filter 82 may correspond to the auxiliary frequency. Each of these signals may be supplied to a respective measurement node 91 for the operating frequency sensed signal and 92 for the auxiliary frequency sensed signal. The processing circuitry 14 receives a value from each measurement node 91 and 92 indicating the voltage sensed by the respective measurement node 91 and 92. Based on the value associated with the auxiliary frequency at measurement node 92, the processing circuitry 14 determines whether a residual voltage (e.g., that affects device performance) is present on the mass 44 or sense electrodes 52 and 53 at step 215. As an example, the processing circuitry 14 may compare the auxiliary frequency sensed signal received from the measurement node 92 to a threshold and determine that a residual voltage is present if this auxiliary frequency sensed signal exceeds the threshold. Otherwise, the processing circuitry 14 may determine that a residual voltage does not currently exist on the mass 44 or the sense electrodes 52 and 53.

If the processing circuitry 14 determines that a residual voltage is present, the processing circuitry 14 may perform at least one predefined action in response to the presence of the residual voltage at step 222. As an example, the processing circuitry 14 may transmit a warning message to warn a user or an external component or system of the presence of the residual voltage or possible errors resulting from the residual voltage. In another example, the processing circuitry 14 may take one or more corrective actions to compensate for the residual voltage, such as adjust the measurements from the measurement nodes 91 and 92, apply a compensation signal to the proof mass 44, or attempt to discharge the residual charge on the mass 44 that is causing the residual voltage.

Note that the steps shown by FIG. 6 may be repeated as often as desired and also may be performed while the system 30 is taking measurements of a motion parameter (e.g., acceleration) based on the operating signal generated by the signal generator 49 and an operating frequency sensed signal received via filter 81 and measurement node 91.

Figure 7:
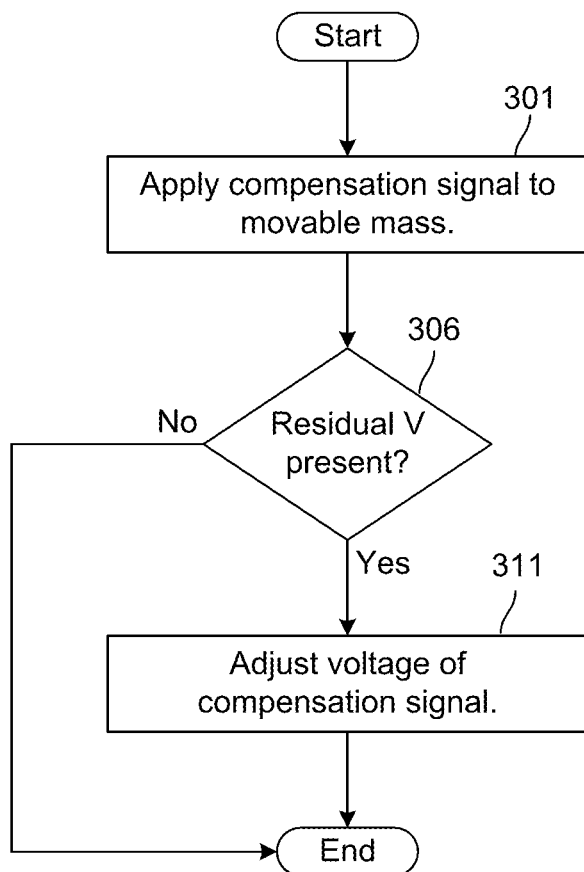
FIG. 7 shows exemplary steps for compensating for a residual voltage on a movable proof mass or a sense electrode of a motion sensing system in accordance with some embodiments of the present disclosure.

FIG. 7 depicts exemplary steps for compensating for residual voltage based on feedback from the auxiliary signal. The process of FIG. 7 may be performed when the processing circuitry 14 determines that a residual voltage is present. As an example, the process of FIG. 7 may be used to implement step 222 of FIG. 6.

At step 301 of FIG. 7, the processing circuitry 14 controls the compensation circuitry 101 in order to apply a compensation signal to the movable proof mass 44 or to other electrodes (e.g., sense electrodes, auxiliary electrodes, or compensation electrodes). At step 306, the processing circuitry 14 determines whether residual voltage effects are still present after application of the compensation signal. Note that the processing circuitry 14 may make such a determination through application of an auxiliary signal, as described above with respect to FIG. 6.

If there is no residual voltage effect present, then the processing ends. Otherwise, the processing circuitry 14 controls the compensation circuitry 101 in order to adjust the voltage of the compensation signal at step 311. As an example, the voltage of the compensation signal may be increased by a predefined amount or an amount based on the amount of residual voltage sensed at step 306. After the compensation signal is adjusted, the processing circuitry 14 again determines whether residual voltage effects are still present at step 306. The voltage of the compensation signal may be repeatedly adjusted until the processing circuitry 14 determines that no residual voltage effect remains.

In various embodiments described above, the auxiliary signal is described as being applied to the moveable proof mass 44 through auxiliary electrodes 62 and 63 and sensed with the sense electrodes 52 and 53. However, it should be emphasized that the auxiliary signal may be applied through or sensed by any electrode. As an example, if desired, the auxiliary signal may be applied to the proof mass 44 through one or more sense electrodes 52 and 53 and sensed by the auxiliary electrodes 62 and 63 or any other electrodes in the system 30. Since the auxiliary signal is at a different frequency than the operating signal that is used to determine the position of the proof mass 44, no error may be introduced by applying the auxiliary signal to the sense electrodes 52 and 53.

As described above, various types of corrective actions can be taken to modify the operation of the MEMS device in response to a determination that a residual voltage is present on a proof mass 44 or sense electrodes. In some embodiments, the processing circuitry 14 may be configured to select a desired action to take based on the amount of residual voltage sensed by the system 30. Measurements of the auxiliary frequency sensed signal may be compared to multiple thresholds, and the type of corrective action selected may depend on the extent to which the measurements exceed the thresholds. As an example, the processing circuitry 14 may compare a measurement of the auxiliary frequency sensed signal to at least two thresholds. If the lower threshold is exceeded without exceeding the upper threshold, then the processing circuitry 14 may take one action (e.g., transmitting a warning message) but if upper threshold is exceeded, then the processing circuitry 14 may be configured to take a different action, such as attempt to compensate for the residual charge (e.g., by discharging the proof mass 18, adjusting the measurements, or performing some other corrective action).

Note that it is unnecessary for the processing circuitry 14 to modify the operation of the MEMS device in the same way each time it takes corrective action. As an example, the processing circuitry 14 may change the type of corrective action taken or the extent that a characteristic of the MEMS device is adjusted based on which threshold is exceeded. In this regard, for a measurement of the residual voltage, the processing circuitry 14 may compare the measurement to a plurality of thresholds that are respectively correlated with different adjustments. For example, one threshold may be associated with a first scaling factor and another threshold may be associated with a second scaling factor. After a sensed signal is received, the processing circuitry 14 may compare the plurality of thresholds to the portion of the signal having the first harmonic frequency of the auxiliary signal to determine the largest threshold that is exceeded by such portion. The processing circuitry 14 may then be configured to use the scaling factor associated with such threshold in processing the signals from the measurement node 91 having the frequency of the operating signal from the signal generator 49. At a subsequent time, the processing circuitry 14 may perform the same process but determine that another threshold is now the largest one exceeded and, thus, use a new scaling factor associated with this threshold in processing the signals from the measurement node 91. In such example, the processing circuitry 14 effectively adjusts the modification applied to the MEMS device by using a new scaling factor (i.e., the scaling factor associated with the largest threshold now exceeded).

In other embodiments, the processing circuitry 14 may make other types of changes based on the largest threshold that is exceeded. As an example, the processing circuitry 14 may adjust the scaling factor in response to a determination that a first threshold is the largest one exceeded and subsequently attempt to discharge the proof mass 44 or adjust a position of the proof mass 44 in response to a determination that a different threshold is the largest one exceeded.

Figure 8:
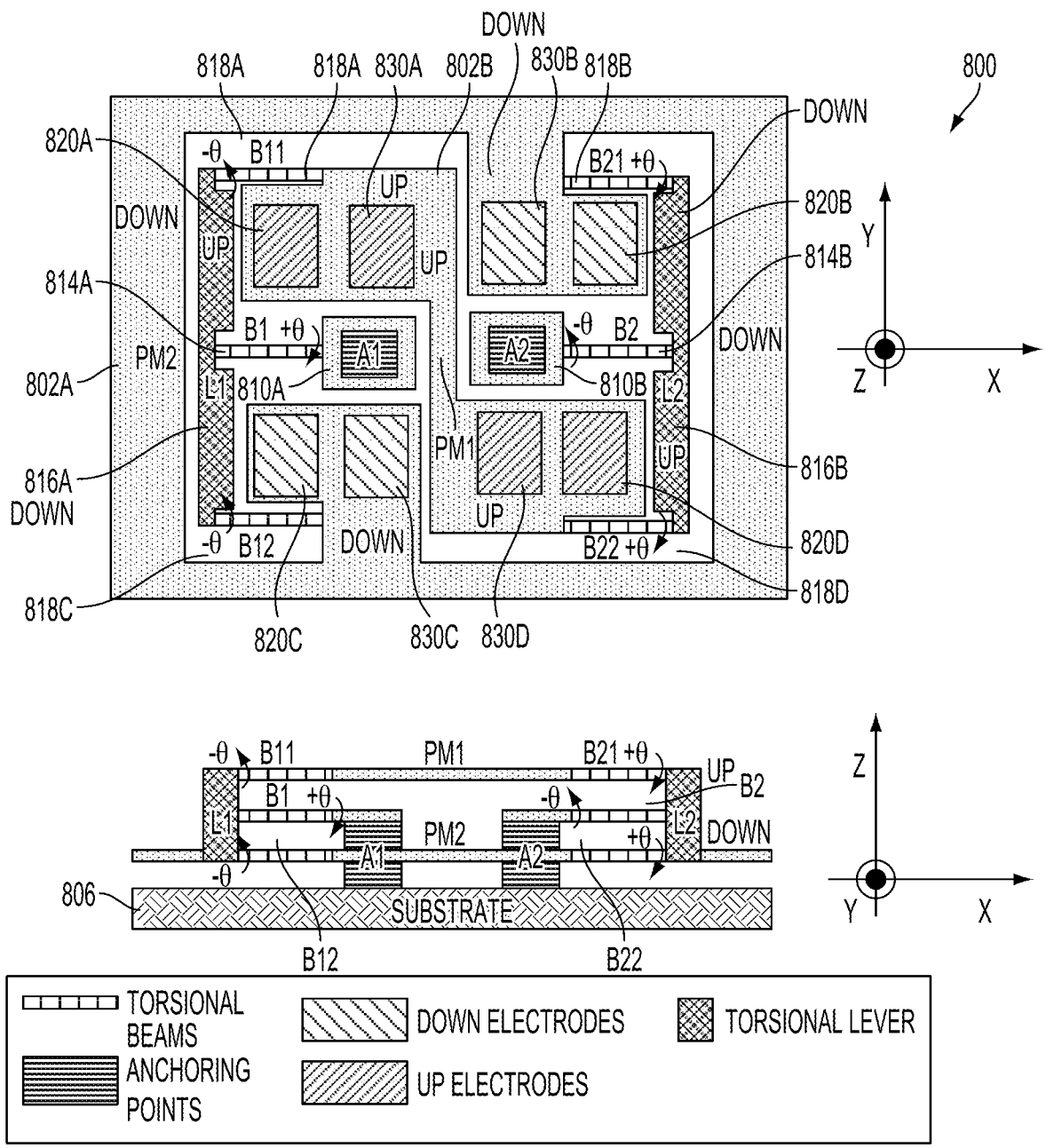
FIG. 8 shows an illustrative motion sensing system having movable proof masses that move in anti-phase direction normal to a plane of a substrate in accordance with some embodiments of the present disclosure.

It should also be emphasized that the techniques described above for sensing residual voltage and compensating for residual voltage may be used with various types of sensors. As an example, FIG. 8 shows top and side views of an accelerometer 800 that responds to a linear acceleration in a Z direction. The accelerometer 800 comprises two proof masses PM1 802B and PM2 802A that respond to a linear acceleration in the Z direction by moving in anti-phase direction normal to a plane of a substrate 806. The anti-phase movement is constrained by a flexible coupling between the two proof masses PM1 802B and PM2 802A and the substrate 806. The flexible coupling comprises two separated anchoring points A1 810A and A2 810B, two central torsional springs B1 814A and B2 814B, two rotational levers L1 816A and L2 816B and four external torsional springs B11 818A, B21 818B, B12 818C and B22 818D. The motion of the accelerometer 800 is measured by an out-of-plane transducer on the proof masses, for instance a set of capacitive differential sense electrodes 820A-820D.

The springs B1 814A and B2 814B connect the anchoring points A1 810A and A2 810B to the levers L1 816A and L2 816B. The four external torsional springs B11 818A, B21 818B, B12 818C and B22 818D connect the end of one lever to the end of the other lever on the opposite side trough the two proof masses PM1 802B and PM2 802A. In particular spring B11 818A connects the top of the left lever L1 816A to internal proof mass PM1 802B that connects the bottom of the right lever L2 816B through the spring B22 818D. In the same way the bottom of the left lever L1 816A is coupled to the top of the right lever L2 816B with the springs B12 818C and B22 818D.

For simplicity, suppose that the proof masses have the center of gravity on the axis of the central springs (B1 814A and B2 814B) and that the external springs (B12 818C, B21 818B, B11 818A and B22 818D) are coupled to the proof masses with the same distance from the center of gravity orthogonal to this axis. A more general case is described in the following.

A linear acceleration a in the Z direction will create a force in Z for each proof mass:

$$F_{PM1}=m_1 a \quad (9)$$

$$F_{PM1}=m_2 a \quad (10)$$

where $m_1$ and $m_2$ are the masses of PM1 802B and PM2 802A respectively. On each proof mass half of this force acts on each one of the external springs, B11 818A and B22 818D for PM1 802B and B12 818C and B21 818B for PM2 802A. Finally this force is transferred on the extreme of the lever so in the center of the lever there is a torque that is the difference of this force times the lever of PM1 802B and PM2 802A:

$$M = \frac{m_1 a}{2} l_{PM1} - \frac{m_2 a}{2} l_{PM2} \quad (11)$$

where the lever length of PM1 $l_{PM1}$ is the distance from the springs B11 818A to B1 814A and B22 818D to B2 814B and $l_{PM2}$ is the distance from the springs B12 818C to B1 814A and B21 818B to B2 814B. The torque M causes the central springs and the two levers to rotate in anti-phase and so one proof mass moves towards the substrate and the other moves in the opposite direction.

In order to cause the anti-phase movement there must be an unbalancing torque M. This unbalanced torque M can be given by a difference in the mass ($m_1 \neq m_2$), by difference in the lever ($l_{PM1} \neq l_{PM2}$), or by a difference in the mass lever product ($m_1 l_{PM1} \neq m_2 l_{PM2}$).

In a more general example, where the center of gravity of the mass is not lying on the spring axis or the external springs are not coupled to proof masses with the same distance orthogonal to this axis, the acceleration causes a torque in addition to the force in the Z direction. In this case the structure of sensor also rotates. The sensor also includes a transducer to measure the motion of the sensor. For instance capacitive sensing can be performed by means of sense electrodes 820A-820D on the substrate measuring the capacitance change due to the mass motion.

As shown by FIG. 8, auxiliary electrodes 830A-830D may be positioned on opposite sides of each anchoring point, similar to the embodiment described above for FIG. 2, in order to apply an auxiliary signal on opposite sides of each proof mass. Using the techniques described above, application of the auxiliary signal to the proof masses or otherwise may be used to sense residual voltage on a proof mass or on electrodes facing the proof mass and, if desired, to compensate for any such residual voltage. In yet other embodiments, the techniques described herein may be used to sense residual voltage for other types of sensors and also to compensate for such residual voltage.

The foregoing description includes exemplary embodiments in accordance with the present disclosure. These examples are provided for purposes of illustration only, and not for purposes of limitation. It will be understood that the present disclosure may be implemented in forms different from those explicitly described and depicted herein and that various modifications, optimizations, and variations may be implemented by a person of ordinary skill in the present art, consistent with the following claims.

What is claimed is:

1. An accelerometer, comprising:
    one or more proof masses of the accelerometer having one or more planar surfaces, wherein the one or more proof masses are fixed in an absence of a force perpendicular to the one or more planar surfaces;
    a plurality of auxiliary electrodes located opposite the one or more planar surfaces;
    a signal generator configured to apply an auxiliary signal to the plurality of auxiliary electrodes, the auxiliary signal having a first harmonic frequency;
    a plurality of sense electrodes located opposite the one or more planar surfaces, wherein, in an absence of a residual voltage on the one or more proof masses, the one or more planar surfaces do not move relative to the plurality of sense electrodes in response to the auxiliary signal; and
    circuitry coupled to provide a sensed signal based on a signal from the plurality of sense electrodes, wherein the circuitry identifies a portion of the sensed signal having the first harmonic frequency, wherein a first force perpendicular to the one or more planar surfaces is generated by an interaction of the auxiliary signal and the residual voltage, wherein the first force causes a movement of the one or more planar surfaces relative to the plurality of sense electrodes that corresponds to the portion of the sensed signal, wherein the circuitry determines, based on the portion of the sensed signal, that a residual voltage is present on the one or more proof masses or the plurality of sense electrodes, and wherein the circuitry modifies an operation of the accelerometer based on a determination that the residual voltage is present on the one or more proof masses or the plurality of sense electrodes.

2. The accelerometer of claim 1, wherein the circuitry is configured to modify the operation of the accelerometer by modifying a tilt of the one or more proof masses.

3. The accelerometer of claim 1, wherein the circuitry is configured to determine that the residual voltage is present by comparing an amplitude of the portion of the sensed signal to a first threshold.

4. The accelerometer of claim 3, wherein the first threshold corresponds to a minimum value at which the residual voltage affects device performance.

5. The accelerometer of claim 1, wherein the circuitry is configured to determine that the residual voltage is present by comparing an amplitude of the portion of the sensed signal to a plurality of thresholds, and the circuitry is configured to take different forms of corrective action based on a largest threshold of the plurality of thresholds that is exceeded.

6. The accelerometer of claim 5, wherein the different forms of corrective action comprise changing a scaling factor, applying a compensating voltage at one or more of the plurality of auxiliary electrodes, or applying a compensating voltage at one or more of the plurality of sense electrodes.

7. The accelerometer of claim 1, wherein the first harmonic frequency is less than half of a resonance frequency for the accelerometer.

8. The accelerometer of claim 7, wherein a second harmonic of the first harmonic frequency is less than half of the resonance frequency for the accelerometer.

9. The accelerometer of claim 1, wherein the first harmonic frequency is greater than a resonance frequency for the accelerometer.

10. The accelerometer of claim 1, wherein both the first harmonic frequency and a second harmonic frequency are more than 5% away from a resonance frequency for the accelerometer.

11. The accelerometer of claim 1, wherein the plurality of auxiliary electrodes and the plurality of sense electrodes are located on a planar surface of a substrate.

12. The accelerometer of claim 11, wherein the one or more proof masses move such that, when a first one of the one or more planar surfaces of the one or more proof masses moves towards the planar surface of the substrate, at least a second one of the one or more planar surfaces moves in an opposite direction.

13. The accelerometer of claim 12, wherein the plurality of auxiliary electrodes comprises a first auxiliary electrode and a second auxiliary electrode, and wherein the first and second auxiliary electrodes are each located on the planar surface of the substrate facing the one or more planar surfaces of the one or more proof masses.

14. The accelerometer of claim 13, wherein the one or more proof masses comprise a first proof mass, wherein the first auxiliary electrode and the second auxiliary electrode are located relative to the first proof mass such that the first proof mass is symmetric with respect to the first auxiliary electrode and the second auxiliary electrode, and wherein the auxiliary signal applied to the first auxiliary electrode and the auxiliary signal applied to the second auxiliary electrode are AC differential signals.

15. The accelerometer of claim 1, wherein the auxiliary signal applied to a first auxiliary electrode of the plurality of auxiliary electrodes has a first polarity, and wherein the auxiliary signal applied to a second auxiliary electrode of the plurality of auxiliary electrodes has an opposite polarity from the first polarity.

16. The accelerometer of claim 1, wherein the circuitry is configured to modify the operation of the accelerometer by applying a compensation voltage to a compensation electrode.

17. The accelerometer of claim 16, wherein the compensation electrode is one of the auxiliary electrodes.

18. The accelerometer of claim 16, wherein the compensation electrode is one of the sense electrodes.

19. The accelerometer of claim 1, further comprising an operating signal generator configured to apply an operating signal to the plurality of sense electrodes, the operating signal having an operating frequency different than the first harmonic frequency.

20. The accelerometer of claim 1, further comprising an operating signal generator configured to apply an operating signal to the one or more proof masses, the operating signal having an operating frequency different than the first harmonic frequency.

21. The accelerometer of claim 1, wherein, in the absence of the residual voltage on the one or more proof masses, the one or more planar surfaces do not move relative to the plurality of sense electrodes in response to the auxiliary signal based on a cancellation of electrostatic forces generated by the auxiliary signal within the one or more proof masses.

* * * * *